United States Patent
Yuan et al.

(10) Patent No.: US 10,263,209 B2
(45) Date of Patent: Apr. 16, 2019

(54) FLUORESCENT/PHOSPHORESCENT MIXED WHITE ORGANIC LIGHT-EMITTING DIODE

(71) Applicant: Shenzhen China Star Optoelectronics Technology Co., Ltd., Shenzhen, Guangdong (CN)

(72) Inventors: Wei Yuan, Guangdong (CN); Aiguo Tu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/500,284

(22) PCT Filed: Jan. 20, 2017

(86) PCT No.: PCT/CN2017/071957
§ 371 (c)(1),
(2) Date: Jan. 31, 2017

(87) PCT Pub. No.: WO2018/036101
PCT Pub. Date: Mar. 1, 2018

(65) Prior Publication Data
US 2018/0219168 A1    Aug. 2, 2018

(30) Foreign Application Priority Data

Aug. 26, 2016 (CN) .......................... 2016 1 0735764

(51) Int. Cl.
*H01L 51/50* (2006.01)
*H01L 51/00* (2006.01)

(52) U.S. Cl.
CPC ............ *H01L 51/504* (2013.01); *H01L 51/50* (2013.01); *H01L 51/5004* (2013.01); *H01L 51/5016* (2013.01); *H01L 51/005* (2013.01); *H01L 51/006* (2013.01); *H01L 51/0035* (2013.01); *H01L 51/0037* (2013.01); *H01L 51/0043* (2013.01); *H01L 51/0058* (2013.01); *H01L 51/0059* (2013.01); *H01L 51/0061* (2013.01); *H01L 51/0067* (2013.01); *H01L 51/0072* (2013.01); *H01L 51/0085* (2013.01); *H01L 2251/5376* (2013.01); *H01L 2251/552* (2013.01); *H01L 2251/558* (2013.01)

(58) Field of Classification Search
CPC . H01L 5/504; H01L 51/5004; H01L 51/5016; H01L 51/50; H01L 51/0035; H01L 51/0037; H01L 51/0043; H01L 51/005; H01L 51/0058; H01L 51/0059; H01L 51/006; H01L 51/0061; H01L 51/0067; H01L 51/0072; H01L 51/0085
USPC ............................................................ 257/40
See application file for complete search history.

(56) References Cited

U.S. PATENT DOCUMENTS

2009/0189509 A1* 7/2009 Qiu .................... H01L 51/0058
                                                            313/498
2015/0236226 A1* 8/2015 Fujita .................... H01L 33/504
                                                            257/98

* cited by examiner

*Primary Examiner* — Chuong A Luu
(74) *Attorney, Agent, or Firm* — Andrew C. Cheng

(57) ABSTRACT

Disclosed is a fluorescent/phosphorescent mixed white organic light-emitting diode, which has high efficiency and good spectral stability.

14 Claims, 2 Drawing Sheets

FLUORESCENT/PHOSPHORESCENT MIXED WHITE ORGANIC LIGHT-EMITTING DIODE

CROSS-REFERENCE TO RELATED APPLICATIONS

This application claims the priority of Chinese patent application CN201610735764.4, entitled "Fluorescent/phosphorescent mixed white organic light-emitting diode" and filed on Aug. 26, 2016, the entirety of which is incorporated herein by reference.

FIELD OF THE INVENTION

The present disclosure relates to the technical field of organic light-emitting diode, and in particular, to a fluorescent/phosphorescent mixed white organic light-emitting diode.

BACKGROUND OF THE INVENTION

Based on difference in light emitting materials, white organic light-emitting diodes (OLED) can be divided into full-fluorescent white light device, full-phosphorescent white light device, and fluorescent/phosphorescent mixed white light device. In the full-fluorescent white light device, only singlet excitons which account for 25% of total excitons can be utilized by a fluorescent dye, while remaining triplet excitons which account for 75% of the total excitons cannot be effectively utilized. The triplet excitons are dissipated in a form of heat radiation finally, and cannot make a contribution to light emission. Therefore, a theoretical maximum value of internal quantum efficiency of the full-fluorescent white light device is only 25%. As to the full-phosphorescent white light device, by an action of heavy atom coupling, energy levels of singlet excitons and triplet excitons are mutually mixed, so that energy of the triplet excitons, which is originally prohibited, is relieved and phosphorescence is emitted. Therefore, internal quantum efficiency of the full-phosphorescent white light device can reach 100% theoretically. At present, white light devices having high efficiency which are reported in the literature are all white light devices based on full-phosphorescent. However, due to a limitation caused by unsatisfactory luminescence lifetime of a blue phosphorescent dye, the full-phosphorescent white light device cannot satisfy actual application requirements in most fields. As to the fluorescent/phosphorescent mixed white light device, a stable blue fluorescent dye and a long-wavelength phosphorescent dye with high efficiency are used together. These two luminescent dyes work together, so that stability can be ensured and high efficiency can be obtained at the same time for the fluorescent/phosphorescent mixed white light device. Therefore, difficulties for the full-fluorescent white light device and the full-phosphorescent white light device are solved effectively. The fluorescent/phosphorescent mixed white light device becomes a better choice, and it has attracted wide attentions in the industry.

At present, as to the fluorescent/phosphorescent mixed white light devices, there are still some urgent problems which need to be solved. (1) Structural styles are too monotonous, and there is a lack of novel structural designs. (2) Compared with a full-phosphorescent white light device having high efficiency, efficiency of a fluorescent/phosphorescent mixed white light device is still relatively low. (3) When a fluorescent/phosphorescent mixed white light device has high brightness, efficiency attenuation thereof is too fast. (4) High CRI (color rendering index), good CIE (coherent infrared energy) and stable spectra cannot be ensured at the same time.

SUMMARY OF THE INVENTION

In order to solve the problems existing in the prior art, the present disclosure provides a fluorescent/phosphorescent mixed white organic light-emitting diode. A light emitting layer of the fluorescent/phosphorescent mixed white organic light-emitting diode comprises a blue light emitting layer, a green light emitting layer, and a red light emitting layer. The blue light emitting layer comprises a body material and a blue fluorescent material, and the body material of the blue light emitting layer comprises an electron-type body material. In the fluorescent/phosphorescent mixed white organic light-emitting diode without any interlayer provided in the present disclosure, transmissions of electrons and hole carriers in respective light emitting areas can be reasonably regulated, and long-range migration and endothermal energy transmission of triplet excitons can be skillfully utilized. In this way, after a structure of a device is gradually optimized, high-performance WOLEDs (white organic light-emitting diodes) are obtained. It is shown that, efficiency of the device is high, and the device has good spectral stability. Moreover, under high brightness, efficiency attenuation of the device is reduced obviously, and the device shows good electroluminescence (EL) performance.

According to a preferable embodiment of the present disclosure, a body material of the red light emitting layer comprises a hole-type body material.

According to a preferable embodiment of the present disclosure, a body material of the green light emitting layer comprises a hole-type body material.

According to a preferable embodiment of the present disclosure, the body material of the blue light emitting layer further comprises a hole-type body material.

According to a preferable embodiment of the present disclosure, a body material of the green light emitting layer comprises an electron-type body material.

According to a preferable embodiment of the present disclosure, the electron-type body material is 1,3,5-tris [(3-pyridyl)-3-phenyl] benzene (TmPyPb).

According to a preferable embodiment of the present disclosure, the blue fluorescent material is bis [N-(1-naphthyl)-N-phenyl-amino] quaterphenyl (4P-NPD) and/or 4,4'-bis (2,2-diphenylvinyl) biphenyl (DPVBi).

According to a preferable embodiment of the present disclosure, the hole-type body material is 4,4',4"-tris (9-carbazolyl) triphenylamine (TCTA).

According the present disclosure, the blue light emitting layer has a thickness in a range from 5 nm to 15 nm; the green light emitting layer has a thickness in a range from 5 nm to 20 nm; and the red light emitting layer has a thickness in a range from 2 nm to 10 nm.

According to a preferable embodiment of the present disclosure, in the blue light emitting layer, a mass ratio of the blue fluorescent material to the body material is in a range from 1:1 to 1:60.

According to a preferable embodiment of the present disclosure, in the body material of the blue light emitting layer, a mass ratio of the electron-type body material to the hole-type body material is in a range from 0.5:1 to 3:1.

According to some embodiments, the blue light emitting layer comprises TmPyPb and 4P-PND. A blue fluorescent dye 4P-NPD having a relatively high hole-transmission property and the electron-type body material TmPyPb are doped in a same layer, which is a blue light emitting layer and also functions as a middle adjusting layer. Meanwhile, the green light emitting layer is placed at a cathode side. Due to a bipolar transmission property of the blue light emitting layer, an exciton generation area stretches across the entire blue light emitting layer, and a width of the exciton generation area is broadened. Besides, a concentration of triplet excitons is reduced, and roll-off of the device can be effectively controlled. Preferably, a mass ratio of TmPyPb to 4P-PND is in a range from 2:1 to 6:1, for example, 3:1.

According to some embodiments, the blue light emitting layer comprises TCTA, TmPyPb and 4P-PND. By introducing the hole-type body material TCTA to the blue light emitting layer, a pressure of 4P-PND which functions as both a luminescent dye and a hole transmission body in a previous technical solution is relieved. In this way, a doping ratio of 4P-PND can be reduced effectively, so that 4P-PND plays a role of the luminescent dye only. Preferably, a ratio of a total mass of TCTA and TmPyPb to a mass of 4P-PND is in a range from 1:1 to 60:1.

According to some embodiments, the body material of the red light emitting layer comprises TCTA.

According to some embodiments, the body material of the green light emitting layer comprises TCTA.

Preferably, TCTA is selected as body materials of the red light emitting layer and the green light emitting layer, and the hole-type body material TCTA and the electron-type body material TmPyPb are used to form a mixed body of the blue light emitting layer, so that the blue light emitting layer has a bipolar transmission capability. In this way, the hole-type material TCTA is used as bodies of light emitting layers of three primary colors. Accordingly, potential barriers that may exist among layers can be reduced, and hole carriers and excitons can transmit more smoothly among respective light emitting areas. An exciton recombination area is located at a light emitting side and stretches across the entire blue light emitting layer. Triplet excitons generated therein are transmitted to dye molecules in each layer in a stepped energy transmission manner, and the dye molecules radiate recombination light, which is beneficial for improving spectral stability.

According to some embodiments, the red phosphorescent material is Ir(MDQ)$_2$(acac), and a mass ratio of the red phosphorescent material to the body material is preferably in a range from 1:0.05 to 1:0.1. According to some embodiments, the green phosphorescent material is Ir(ppy)$_2$, and a mass ratio of the green phosphorescent material to the body material is in a range from 1:0.05 to 1:0.1.

According to some embodiments of the present disclosure, the light emitting layer is formed by the red light emitting layer, the blue light emitting layer, and the green light emitting layer which are superposed sequentially in a direction from an anode to a cathode.

According to some embodiments, the light emitting layer is formed by the red light emitting layer, the green light emitting layer, and the blue light emitting layer which are superposed sequentially in a direction from an anode to a cathode.

The present disclosure has the following beneficial effects.

(1) The structure of the device can be simplified, and efficiency of the device can be improved. A commonly used interlayer in a traditional fluorescent/phosphorescent mixed white light device having multiple light emitting layers is omitted.

(2) Roll-off of the device can be reduced. A primary reason is that a bipolar mixed body is used in the blue light emitting layer. This is different from a structure reported in related papers, in which an exciton generation area is located at an interface between two functional layers. A bipolar property enables the exciton generation area to stretch across the entire blue light emitting layer, and a width of the exciton generation area can be broadened. Besides, accumulation of space charges and a concentration of triplet excitons in the exciton generation area under high brightness can be effectively reduced, so that occurrence rates of TTA (triplet-triplet-annihilation) and TPQ (triplet-polaron-quenching) can be reduced, and roll-off of the device can be reduced.

(3) The structure of the device can be used universally. High efficiency, stable spectra, and relatively high CRI of the device have great significance to actual applications of the fluorescent/phosphorescent mixed white light device.

BRIEF DESCRIPTION OF THE DRAWINGS

The accompanying drawings are used to provide further understandings of the present disclosure and constitute one part of the description. The drawings are used for interpreting the present disclosure together with the embodiments, not for limiting the present disclosure. In the drawings.

DETAILED DESCRIPTION OF THE EMBODIMENTS

The present disclosure will be explained in details hereinafter with reference to the embodiments, but the present disclosure is not limited by the embodiments.

Materials for forming a light emitting layer in a preparation process of a device in the present disclosure are provided as follows.

For an anode, commercial ITO (indium tin oxide) glass with good electrical conductivity and light transmittance is selected, and resistance per unit area of ITO is 10 Ω/cm$^2$. For a cathode, Cs$_2$CO$_3$/Al is selected.

Other materials used include PEDOT: PSS, NPB, TCTA, Ir(MDQ)$_2$(acac), Ir(ppy)$_2$(acac), 4P-NPD, DPVBi, and TmPyPb, and the structures thereof are shown as follows:

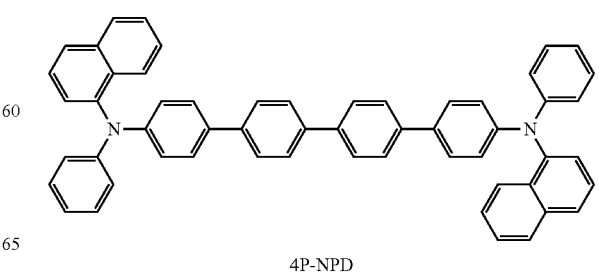

4P-NPD

-continued

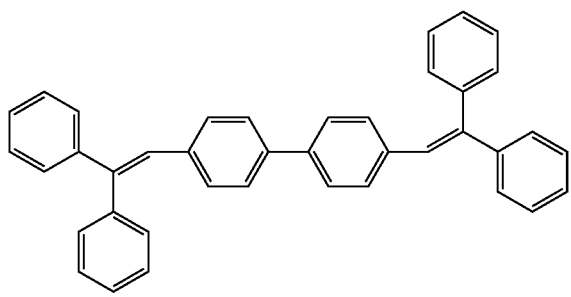

DPVBi

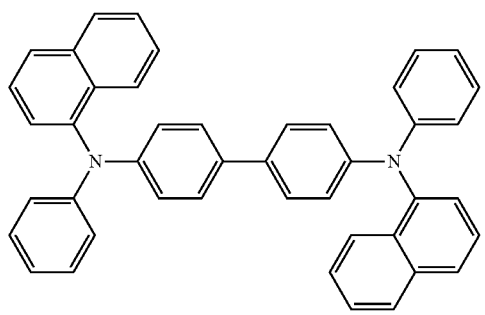

NPB

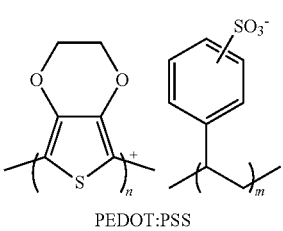

PEDOT:PSS

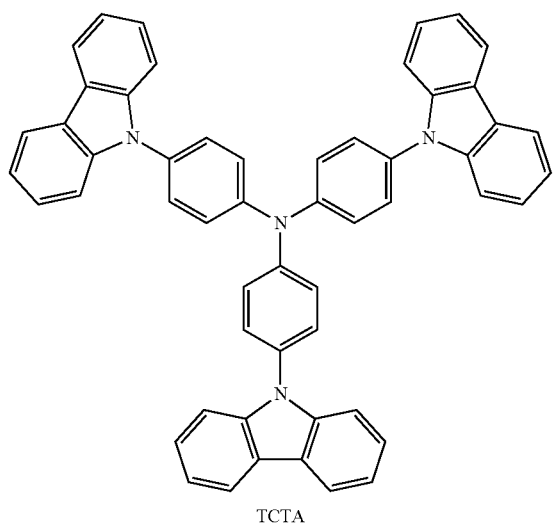

TCTA

-continued

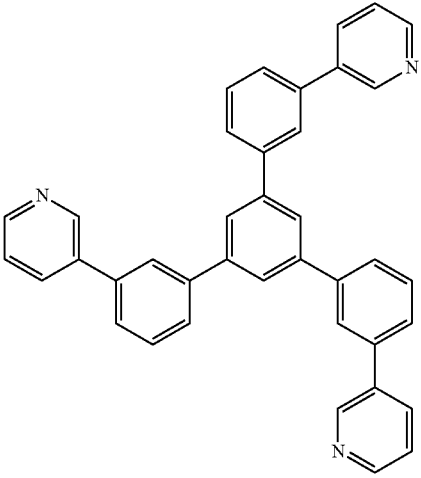

TmPyPB

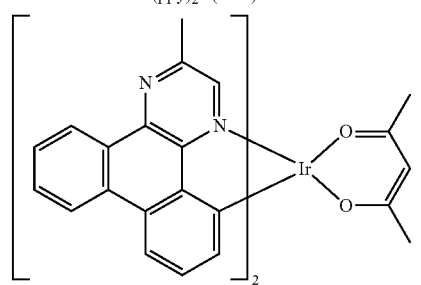

(ppy)$_2$Ir(acac)

(MQD)$_2$Ir(acac)

Embodiment 1

Figure 1:
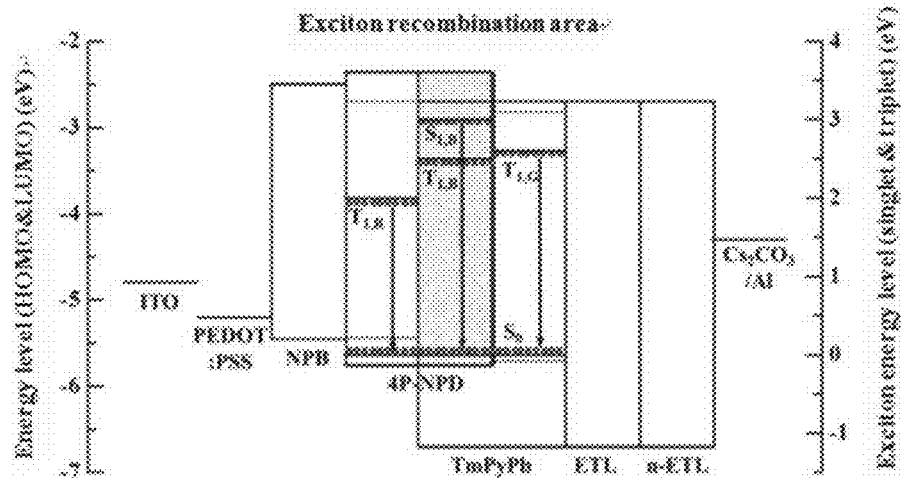
FIG. 1 schematically shows an energy level and a structure of an organic light-emitting diode according to embodiment 1.

A white organic light-emitting diode, color of which is regulated by a double doped blue light emitting layer, has a following structure: ITO/PEDOT/NPB (15 nm)/4P-NPD:2 wt % Ir(MDQ)$_2$(acac) (5 nm)/4P-NPD:TmPyPb=1:3 (10 nm)/TmPyPb:8 wt % Ir(ppy)$_2$ (10 nm)/TmPyPb (12 nm)/n-ETU/Al, which is shown in FIG. 1. Maximum current efficiency, external quantum efficiency and power efficiency of the OLED respectively can reach 40.3 cd/A, 16.7% and 42.3 lm/W. When brightness is 1000 cd/m$^2$, the maximum current efficiency, external quantum efficiency and power efficiency of the OLED are respectively 35.2 cd/A, 14.8% and 31.8 lm/W. CIE color coordinates of the device are (0.48,0.48); CRI thereof is 81; and electric current density $J_0$ thereof is 53 mA/cm$^2$.

Embodiment 2

Figure 2:
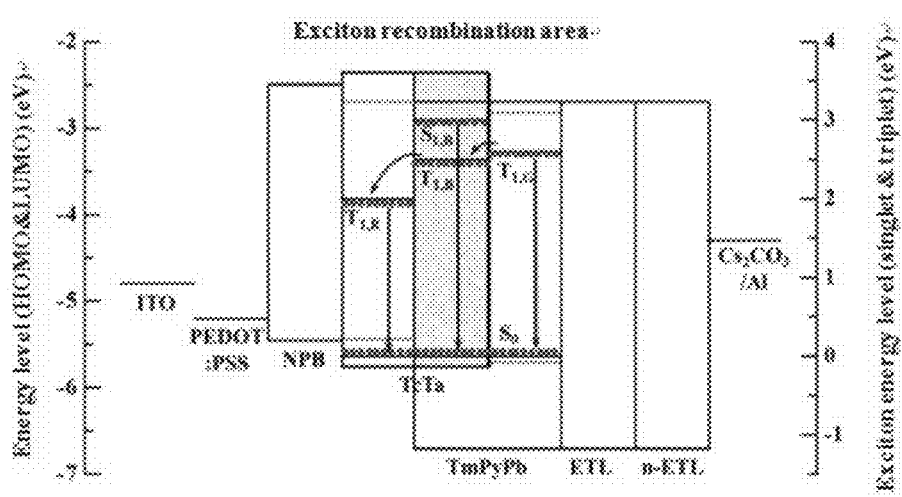
FIG. 2 schematically shows an energy level and a structure of an organic light-emitting diode according to embodiment 2.

A white organic light-emitting diode, color of which is regulated by a triple doped blue light emitting layer, has a following structure: ITO/PEDOT/NPB (15 nm)/TCTA:3 wt % Ir(MDQ)$_2$(acac) (5 nm)/TCTA:TmPyPb:4P-NPD=40 wt %:50 wt %:10 wt % (10 nm)/TmPyPb:8 wt % Ir(ppy)$_2$ (7 nm)/TmPyPb (12 nm)/n-ETL/Al, which is shown in FIG. 2. Maximum current efficiency, external quantum efficiency and power efficiency of the OLED respectively can reach 43.2 cd/A, 20.3% and 50.2 lm/W. When brightness is 1000 cd/m$^2$, the maximum current efficiency, external quantum efficiency and power efficiency of the OLED are respectively 36.6 cd/A, 17.1% and 34.5 lm/W. CIE color coordinates of the device are (0.48.0.46); CRI thereof is 78; and electric current density $J_0$ thereof is 78 mA/cm$^2$.

Embodiment 3

Figure 3:
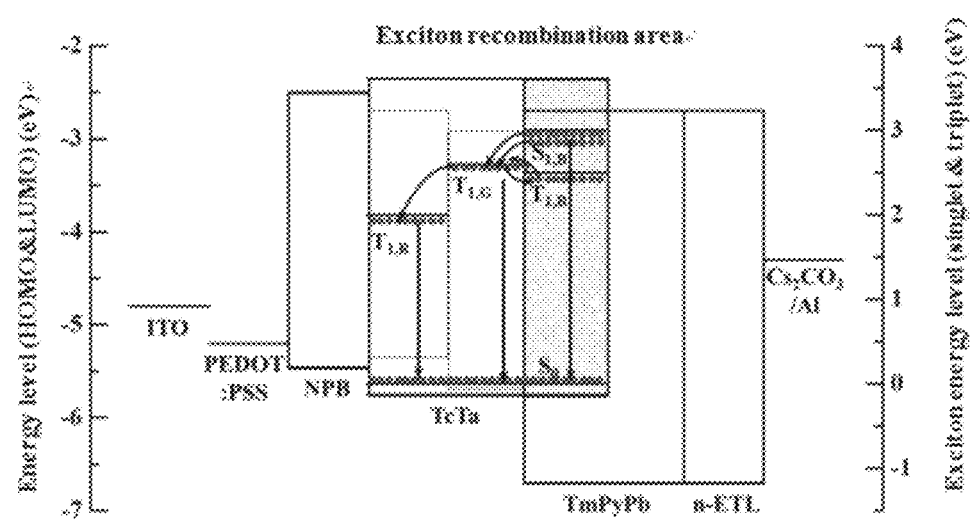
FIG. 3 schematically shows an energy level and a structure of an organic light-emitting diode according to embodiment 3.

A white organic light-emitting diode, in which a triple doped blue light emitting layer is located at a side of red and green light emitting layers, has a following structure: ITO/PEDOT/NPB (15 nm)/TCTA:4 wt % Ir(MDQ)$_2$(acac) (3.5 nm)/TCTA:8 wt % Ir(ppy)$_2$ (5 nm)/TCTA:TmPyPb:4P-NPD=73 wt %:25 wt %:2 wt % (7 nm)/TmPyPb (12 nm)/n-ETL/Al, which is shown in FIG. 3. Maximum current efficiency, external quantum efficiency and power efficiency of the OLED respectively can reach 45.2 cd/A, 19.0% and 41.7 lm/W. When brightness is 1000 cd/m$^2$, the maximum current efficiency, external quantum efficiency and power efficiency of the device can still be maintained at relatively high levels, and can respectively reach 40.5 cd/A, 17.0% and 34.3 lm/W. Electric current density $J_0$, a key index for evaluating roll-up degree of the device, is 105 mA/cm$^2$, which is larger than 100 mA/cm$^2$. Therefore, roll-up of the device is effectively improved.

Although the present disclosure is described hereinabove with reference to some embodiments, various improvements can be made to the embodiments, and components therein can be replaced by equivalents without departing from the protection scope of the present disclosure. In particular, as long as there are no structural conflicts, the technical features disclosed in each and every embodiment of the present disclosure can be combined with one another in any way. The present disclosure does not provide exhaustive descriptions of the combinations, which is only for saving space and resources. Therefore, the present disclosure is not limited to particular embodiments disclosed herein, but includes all technical solutions falling into the scope of the claims.

The invention claimed is:

1. A fluorescent/phosphorescent mixed white organic light-emitting diode, wherein a light emitting layer thereof comprises a blue light emitting layer, a green light emitting layer, and a red light emitting layer, wherein the blue light emitting layer comprises a body material and a blue fluorescent material, the body material of the blue light emitting layer comprising an electron-type body material; the green light emitting layer comprises a green phosphorescent material; and the red light emitting layer comprises a red phosphorescent material, wherein the electron-type body material is 1,3,5-tris r(3-pyridyl)-3-phenyl benzene, and the blue fluorescent material is bis TN-(1-naphthyl)-N-phenyl-aminol quaterphenyl; wherein a body material of the red light emitting layer comprises a hole-type body material, and/or a body material of the green light emitting layer comprises a hole-type body material; wherein the body material of the blue light emitting layer further comprises a hole-type body material, and/or a body material of the green light emitting layer comprises an electron-type body material; wherein the blue light emitting layer has a thickness in a range from 5 nm to 15 nm; the green light emitting layer has a thickness in a range from 5 nm to 20 nm; and the red light emitting layer has a thickness in a range from 2 nm to 10 nm.

2. The organic light-emitting diode according to claim 1, wherein the hole-type body material is 4,4',4"-tris (9-carbazolyl) triphenylamine.

3. The organic light-emitting diode according to claim 1, wherein the hole-type body material is 4,4',4"-tris (9-carbazolyl) triphenylamine.

4. The organic light-emitting diode according to claim 1, wherein the blue light emitting layer has a thickness in a range from 5 nm to 15 nm; the green light emitting layer has a thickness in a range from 5 nm to 20 nm; and the red light emitting layer has a thickness in a range from 2 nm to 10 nm.

5. The organic light-emitting diode according to claim 1, wherein the blue light emitting layer has a thickness in a range from 5 nm to 15 nm; the green light emitting layer has a thickness in a range from 5 nm to 20 nm; and the red light emitting layer has a thickness in a range from 2 nm to 10 nm.

6. The organic light-emitting diode according to claim 1, wherein in the blue light emitting layer, a mass ratio of the blue fluorescent material to the body material is in a range from 1:1 to 1:60.

7. The organic light-emitting diode according to claim 1, wherein in the blue light emitting layer, a mass ratio of the blue fluorescent material to the body material is in a range from 1:1 to 1:60.

8. The organic light-emitting diode according to claim 1, wherein in the blue light emitting layer, a mass ratio of the blue fluorescent material to the body material is in a range from 1:1 to 1:60.

9. The organic light-emitting diode according to claim 1, wherein in the body material of the blue light emitting layer, a mass ratio of the electron-type body material to the hole-type body material is in a range from 0.5:1 to 3:1.

10. The organic light-emitting diode according to claim 1, wherein the light emitting layer is formed by the red light emitting layer, the blue light emitting layer, and the green light emitting layer which are superposed sequentially in a direction from an anode to a cathode.

11. The organic light-emitting diode according to claim 1, wherein the light emitting layer is formed by the red light emitting layer, the blue light emitting layer, and the green light emitting layer which are superposed sequentially in a direction from an anode to a cathode.

12. The organic light-emitting diode according to claim 1, wherein the light emitting layer is formed by the red light emitting layer, the blue light emitting layer, and the green light emitting layer which are superposed sequentially in a direction from an anode to a cathode.

13. The organic light-emitting diode according to claim 1, wherein the light emitting layer is formed by the red light emitting layer, the green light emitting layer, and the blue light emitting layer which are superposed sequentially in a direction from an anode to a cathode.

14. The organic light-emitting diode according to claim 1, wherein the light emitting layer is formed by the red light emitting layer, the green light emitting layer, and the blue light emitting layer which are superposed sequentially in a direction from an anode to a cathode.

* * * * *